(12) United States Patent
Hashimoto et al.

(10) Patent No.: US 8,529,697 B2
(45) Date of Patent: Sep. 10, 2013

(54) GROWTH OF NITRIDE SEMICONDUCTOR CRYSTALS

(75) Inventors: Hideki Hashimoto, Wako (JP); Akihiko Horiuchi, Wako (JP); Hideo Kawanishi, Hachioji (JP)

(73) Assignees: Honda Motor Co., Ltd., Tokyo (JP); Hideo Kawanishi, Tokyo (JP)

( * ) Notice: Subject to any disclaimer, the term of this patent is extended or adjusted under 35 U.S.C. 154(b) by 1581 days.

(21) Appl. No.: 11/659,339

(22) PCT Filed: Aug. 31, 2005

(86) PCT No.: PCT/JP2005/016372
§ 371 (c)(1),
(2), (4) Date: Feb. 5, 2007

(87) PCT Pub. No.: WO2006/025593
PCT Pub. Date: Mar. 9, 2006

(65) Prior Publication Data
US 2007/0256626 A1     Nov. 8, 2007

(30) Foreign Application Priority Data
Aug. 31, 2004 (JP) ................... 2004-253508

(51) Int. Cl.
*C30B 25/00* (2006.01)
(52) U.S. Cl.
USPC .......... 117/93; 117/84; 117/88; 117/89; 117/102; 117/105; 117/952
(58) Field of Classification Search
USPC .......... 117/84, 88, 89, 93, 102, 105, 952
See application file for complete search history.

(56) References Cited

U.S. PATENT DOCUMENTS

| | | | |
|---|---|---|---|
| 6,440,214 B1* | 8/2002 | Hooper et al. | 117/94 |
| 6,537,513 B1* | 3/2003 | Amano et al. | 423/328.2 |
| 2003/0136957 A1* | 7/2003 | Tsuda et al. | 257/14 |
| 2004/0057482 A1* | 3/2004 | Wang | 372/45 |
| 2004/0144300 A1* | 7/2004 | Kitaoka et al. | 117/2 |

FOREIGN PATENT DOCUMENTS

| | | |
|---|---|---|
| JP | 2000-48104 A | 2/2000 |
| JP | 2000-216101 A | 8/2000 |
| JP | 2001-302398 A | 10/2001 |
| JP | 2004-47763 A | 2/2004 |

OTHER PUBLICATIONS

Stacia Keller et al., Proceedings of International Workshop on Nitride Semiconductors IPAP Conf. Series, Sep. 24-27, 2000, pp. 233-236.
Masanobu Hiroki et al., Jpn. J. Appl. Phys., vol. 42, No. 4B, (2003) pp. 2305-2308.

* cited by examiner

Primary Examiner — Matthew Song
(74) Attorney, Agent, or Firm — Birch, Stewart, Kolasch & Birch, LLP

(57) ABSTRACT

A process for growing a crystal of a nitride semiconductor in which after the step of mounting a substrate (12) in a reaction tube (11), the step of feeding a first material gas containing a Group 3 element onto the substrate in the reaction tube and the step of feeding a second material gas containing elemental nitrogen onto the substrate in the reaction tube are carried out alternately to deposit a nitride semiconductor crystal directly on the substrate. The number of moles of the elemental nitrogen contained in the second material gas has a ratio of 200 or more to the number of moles of the Group 3 element in the first material gas.

24 Claims, 12 Drawing Sheets

SiC SUBSTRATE

2 μm SQUARE BY SIMULTANEOUS FEEDING

2 μm SQUARE BY ALTERNATE FEEDING

GROWTH OF NITRIDE SEMICONDUCTOR CRYSTALS

TECHNICAL FIELD

This invention relates to the growth of a nitride semiconductor crystal, and, more particularly, to technology for growing a nitride semiconductor crystal having good flatness and good crystal quality directly on a hetero-geneous substrate.

BACKGROUND ART

The nitride semiconductor crystal refers to gallium nitride (GaN), aluminum nitride (AlN), indium nitride (InN), boron nitride (BN) and a mixture of those crystals (hereinafter called a mixed crystal). The growth of a crystal of a nitride semiconductor is carried out on a substrate of sapphire ($Al_2O_3$) or silicon carbide (SiC) having a hexagonal basic crystal structure and a lattice constant close to it. In order to perform the growth of a crystal with high quality, it is necessary to control the concentration of impurities and the thickness of a grown film strictly.

Molecular beam epitaxy (hereinafter MBE) and vapor-phase epitaxy (hereinafter VPE) are mainly available as the methods for the growth of a nitride semiconductor crystal. VPE includes one in which a material gas to be epitaxially grown flows horizontally relative to s substrate surface (hereinafter horizontal) and one in which it flows vertically (see, for example, JP-A-2000-216101, JP-A-2001-302398, JP-A-2000-49104 and JP-A-2004-47763).

The parameters which require control for epitaxial growth by VPE include substrate temperature, Group 5 material gas/Group 3 material gas feed ratio (hereinafter 5/3 ratio), total amount of gases flowing in the reaction tube (=Group 3 gas+Group 5 gas+carrier gas), internal pressure of the reaction tube and flow rate of gases in the reaction tube, and the adjustment of those parameters makes it possible to control the crystal film thickness, crystal quality, etc.

While a grown film is still very thin relative to the substrate when crystal growth is performed as stated above, it is arranged with a one to one correspondence with an atom in the substrate and their difference in lattice constant is of little importance. When AlN is, for example, grown on SiC, AlN is arranged with the atomic spacing which SiC has. However, as the grown film becomes thicker, it is arranged in accordance with its own lattice constant and in its interface, there normally occur portions failing to have a one to one correspondence with the atoms in the substrate. In other words, lattice defects, such as dislocations, occur and their one to one correspondence is lost. The critical thickness of the film at which dislocations occur is called the critical film thickness.

As a method for the epitaxial growth of compound semiconductor crystals composed of elements of Groups 3 and 5, such as nitride semiconductor crystals, there are a method in which elements of Groups 3 and 5 are simultaneously fed to the substrate in the beginning of growth (hereinafter simultaneous feeding method) and a method in which they are alternately fed (hereinafter alternate feeding method).

It is known that when AlN is epitaxially grown over a thickness causing lattice relaxation (critical film thickness) on the (0001)Si plane of an SiC substrate by using the simultaneous feeding method in a horizontal VPE apparatus, an epitaxial layer of AlN is improved in flatness if the growth parameters are appropriately selected.

On the other hand, the alternate feeding method is a method carried out to keep accurately the periodicity of Group 3 atoms/Group 5 atoms which the compound semiconductor crystal structure has. The alternate feeding method employing a substrate of gallium arsenide is disclosed in literature (Yoshiji Horikoshi, et al., "Surface atomic processes during flow-rate modulation epitaxy", Appl. Surf. Sci., 112, pp.48-54 (1997); Masanobu Hiroki, et al., "Flat Surface and Interface in AlN/GaN Heterostructures and Superlattices Grown by Flow-Rate Modulation Epitaxy", Jpn. J. Appl. Phys., Vol. 42 (2003), pp. 2305-2308).

As a known example employing heterojunction and the simultaneous feeding method, there is a case in which a nitride semiconductor, GaN, is grown directly in a highly limited area on an SiC substrate (hereinafter selective growth) by utilizing the characteristics of the heterojunction between the nitride semiconductor and the SiC substrate. An example of publication of a heterojunction device is described in literature (John T. Torvik, et al., "A GaN/4H-SiC heterojunction bipolar transistor with operation up to 300° C.", MRS Internet J. Nitride Semicond. Res. 4, 3 (1999)).

As a known example employing a buffer layer without forming a nitride semiconductor directly on a heterogeneous substrate, there is a case in which a nitride semiconductor epitaxial layer is used as an optical device (e.g., a blue light-emitting diode). Epitaxial growth in the case in which only a nitride semiconductor is applied as a functional device is effected on that surface of a single-crystal sapphire or SiC substrate on which a buffer layer is formed from a material of the same composition as the nitride semiconductor. The buffer layer is, for example, a film of a nitride semiconductor formed at a low substrate temperature, or one having a superlattice structure of GaN and AlN.

For the epitaxial growth of a nitride semiconductor of high quality, it is most desirable to use a single-crystal substrate of a nitride semiconductor coinciding with it perfectly in lattice constant. However, as no such single-crystal substrate of high quality exists, it is actually the case to use instead a substrate of sapphire or SiC having the same hexagonal crystal system with the nitride semiconductor. Differences in physical constants occur between the substrate and the nitride semiconductor as stated below. More specifically, there occur a difference in lattice constant, a difference in coefficient of thermal expansion and a difference in surface energy.

The differences in physical constants as stated above present a common problem of worsening in crystallinity which occurs as stated below when the epitaxial growth of a nitride semiconductor is effected directly on the substrate.

Firstly, when the critical film thickness is not exceeded, the nitride semiconductor crystal is epitaxially grown with strain to adapt itself to the lattice constant of the substrate, but when it is exceeded, the nitride semiconductor crystal tends to grow epitaxially in accordance with its own lattice constant and the resulting problem is that the atoms in the substrate and the nitride semiconductor do not correspond to each other on a one to one basis, but lattice defects, such as dislocations, occur in the interface. The lattice defects which have occurred extend through the epitaxial layer as they are.

There is also a problem of strain produced in the epitaxial layer with a lowering of the temperature for epitaxial growth to room temperature. This is presumably due to the stress created in the layer by the difference in coefficient of thermal expansion between the substrate and the film deposited thereon. The epitaxial layer may crack, depending on the kind and thickness of the nitride semiconductor.

Another problem occurring from the direct epitaxial growth of a nitride semiconductor on a sapphire or SiC substrate by the simultaneous feeding method based on VPE is that in the region of its interface with the substrate, the nitride semiconductor does not grow in layers but in islands as a result of an intermediate reaction between feed gases (e.g. TMA and $NH_3$). The continuity of the crystal is lost between islands, leading to a lattice defect remaining in the nitride semiconductor in the interface of junction, or a roughened surface as no flat epitaxial layer can be obtained. Since an overlying layer is formed on an underlying island layer serving as a template, it grows with its defect in flatness.

Examples in which the alternate feeding method is presently carried out are all directed to surfaces lying over 3-5 compound semiconductor layers, and there is no epitaxial growth effected directly on the surface of a sapphire or SiC substrate. There has not been known any example in which good results have been obtained from heteroepitaxial growth effected directly on a heterogeneous substrate by using the alternative feeding method.

There is a case in which a nitride semiconductor, GaN, is grown directly in a highly limited area on an SiC substrate, as described in the above-cited literature (John T. Torvik, et al., "A GaN/4H-SiC heterojunction bipolar transistor with operation up to 300° C.", MRS Internet J. Nitride Semicond. Res. 4,3 (1999)). This is, however, unsatisfactory in device performance, including a very low ratio of current amplification, due to the poor electrical characteristics of the heterojunction (interface) between GaN and SiC. Accordingly, there is a demand for the establishment of a method of growing a flat nitride semi-conductor crystal of high quality exhibiting improved electrical characteristics in its heterojunction and capable of playing a satisfactory role as a device.

In known examples of structures in which a buffer layer is formed between a nitride semiconductor layer and a substrate, the buffer layer turns the interface between the substrate and the heterojunction into a region in which defects and strain are concentrated, sacrificing the crystal.

The epitaxial growth of a nitride semiconductor by normal pressure VPE is also defective in that an atmospheric pressure prevailing in the reaction tube causes disorder in the flow of material gases in the vicinity of a heated substrate and makes it impossible to realize epitaxial growth in layers.

DISCLOSURE OF THE INVENTION

According to one aspect of this invention, there is provided a process for growing a crystal of a nitride semiconductor in which after the step of mounting a substrate in a reaction tube, the step of feeding a first material gas containing a Group 3 element onto the substrate in the reaction tube and the step of feeding a second material gas containing elemental nitrogen onto the substrate in the reaction tube are carried out alternately to deposit a nitride semi-conductor crystal directly on the substrate, characterized in that the number of moles of the elemental nitrogen contained in the second material gas has a ratio of 200 or more to the number of moles of the Group 3 element in the first material gas.

According to another aspect of this invention, there is provided a process for growing a crystal of a nitride semiconductor in which after the step of mounting a substrate in a reaction tube, the step of feeding a first material gas containing a Group 3 element onto the substrate in the reaction tube and the step of feeding a second material gas containing elemental nitrogen onto the substrate in the reaction tube are carried out alternately to deposit a nitride semiconductor crystal directly on the substrate, characterized in that the number of moles of the elemental nitrogen contained in the second material gas has a ratio of 450 or more to the number of moles of the Group 3 element in the first material gas.

According to still another aspect of this invention, there is provided a process for growing a crystal of a nitride semiconductor in which after the step of mounting a substrate in a reaction tube, the step of feeding a first material gas containing a Group 3 element onto the substrate in the reaction tube and the step of feeding a second material gas containing elemental nitrogen onto the substrate in the reaction tube are carried out alternately to deposit a nitride semiconductor crystal directly on the substrate, characterized in that the number of moles of the elemental nitrogen contained in the second material gas has a ratio of 200 or more to the number of moles of the Group 3 element in the first material gas until the film thickness of the nitride semiconductor crystal deposited on the substrate reaches the critical film thickness, while the number of moles of the elemental nitrogen contained in the second material gas has a ratio of less than 200 to the number of moles of the Group 3 element in the first material gas when the film thickness is equal to, or over the critical film thickness.

According to still another aspect of this invention, there is provided a process for growing a crystal of a nitride semiconductor in which after the step of mounting a substrate in a reaction tube, the step of feeding a first material gas containing a Group 3 element onto the substrate in the reaction tube and the step of feeding a second material gas containing elemental nitrogen onto the substrate in the reaction tube are carried out alternately to deposit a nitride semiconductor crystal directly on the substrate, characterized in that the number of moles of the elemental nitrogen contained in the second material gas has a ratio of 450 or more to the number of moles of the Group 3 element in the first material gas until the film thickness of the nitride semiconductor crystal deposited on the substrate reaches the critical film thickness, while the number of moles of the elemental nitrogen contained in the second material gas has a ratio of less than 450 to the number of moles of the Group 3 element in the first material gas when the film thickness is equal to, or over the critical film thickness.

According to still another aspect of this invention, there is provided a process for growing a crystal of a nitride semiconductor in which after the step of mounting a substrate in a reaction tube, the step of feeding a first material gas containing a Group 3 element onto the substrate in the reaction tube and the step of feeding a second material gas containing elemental nitrogen onto the substrate in the reaction tube are carried out alternately to deposit a nitride semiconductor crystal directly on the substrate, characterized in that the number of moles of the elemental nitrogen contained in the second material gas has a ratio of more than 250 to the number of moles of the Group 3 element in the first material gas until the film thickness of the nitride semiconductor crystal deposited on the substrate reaches the critical film thickness, while the number of moles of the elemental nitrogen contained in the second material gas has a ratio of from 20 or more to 250 or less to the number of moles of the Group 3 element in the first material gas when the film thickness is equal to, or over the critical film thickness.

According to still another aspect of the present invention, there is provided a process for growing a crystal of a nitride semiconductor in which after the step of mounting a substrate in a reaction tube, the step of feeding a first material gas containing a Group 3 element onto the substrate in the reaction tube and the step of feeding a second material gas containing elemental nitrogen onto the substrate in the reaction tube are carried out alternately to deposit a nitride semiconductor crystal directly on the substrate, the process comprising the steps of: growing the nitride semiconductor crystal deposited on the substrate until a film thickness of the semiconductor crystal reaches a critical film thickness by variously changing, under a predetermined substrate temperature and a predetermined growth pressure, a ratio of the number of moles of the elemental nitrogen contained in the second material gas relative to the number of moles of the Group 3 element contained in the first material gas; measuring the surface flatness of the grown nitride semiconductor crystal; determining, for bringing the surface flatness to a most appropriate level, an optimum ratio of the number of moles of the elemental nitrogen contained in the second material gas relative to the number of moles of the Group 3 element contained in the first material gas; and shifting the ratio of the number of moles of the elemental nitrogen contained in the second material gas relative to the number of moles of the Group 3 element contained in the first material gas, to a value determined in the optimum ratio determining step.

According to still another aspect of the present invention, there is provided a process for growing a crystal of a nitride semiconductor in which after the step of mounting a substrate in a reaction tube, the step of feeding a first material gas containing a Group 3 element onto the substrate in the reaction tube and the step of feeding a second material gas containing elemental nitrogen onto the substrate in the reaction tube are carried out alternately to deposit a nitride semiconductor crystal directly on the substrate, the process comprising the steps of: growing the nitride semiconductor crystal deposited on the substrate until a film thickness of the semiconductor crystal reaches a critical film thickness by variously changing, under a predetermined substrate temperature and a predetermined growth pressure, a ratio of the number of moles of the elemental nitrogen contained in the second material gas relative to the number of moles of the Group 3 element contained in the first material gas; measuring the surface flatness of the grown nitride semiconductor crystal; determining, for bringing the surface flatness to a most appropriate level, a first optimum ratio of the number of moles of the elemental nitrogen contained in the second material gas relative to the number of moles of the Group 3 element contained in the first material gas; growing the nitride semiconductor crystal deposited on the substrate until a film thickness of the semiconductor crystal becomes larger than a critical film thickness by variously changing, under a predetermined substrate temperature and a predetermined growth pressure, a ratio of the number of moles of the elemental nitrogen contained in the second material gas relative to the number of moles of the Group 3 element contained in the first material gas; measuring the surface flatness of the nitride semiconductor crystal grown thicker than the critical film thickness; and determining, for bringing the surface flatness to a most appropriate level, a second optimum ratio of the number of moles of the elemental nitrogen contained in the second material gas relative to the number of moles of the Group 3 element contained in the first material gas, whereby the ratio of the number of moles of the elemental nitrogen contained in the second material gas relative to the number of moles of the Group 3 element contained in the first material gas is set at a value corresponding to the first optimum ratio until the film thickness of the nitride semiconductor crystal deposited on the substrate reaches the critical film thickness, and at a value corresponding to the second optimum ratio after the semiconductor crystal grows thicker than the critical film thickness.

In the process for growing a crystal as set forth above, it is preferable that the number of times that the step of feeding a first material gas containing a Group 3 element onto the substrate in the reaction tube and the step of feeding a second material gas containing elemental nitrogen onto the substrate in the reaction tube are carried out alternately be from one or more times to 10 or less times.

In the process for growing a crystal as set forth above, it is desirable that the number of times that the step of feeding a first material gas containing a Group 3 element onto the substrate in the reaction tube and the step of feeding a second material gas containing elemental nitrogen onto the substrate in the reaction tube are carried out alternately be six times.

The substrate may be of silicon carbide (SiC).

In a preferred form, the substrate comprises a substrate of sapphire ($Al_2O_3$).

Preferably, the substrate has an off angle to a given crystal plane.

The reaction tube has its internal pressure reduced to an appropriate level to effect crystal growth.

Desirably, the nitride semiconductor comprises a crystal of AlN, GaN, InN, BN or any combination of the aforementioned.

According to a further aspect of this invention, there is provided an apparatus for growing a crystal of a nitride semiconductor, having a reaction tube, a substrate mount for mounting a substrate in the reaction tube, a pressure reducing device for reducing the internal pressure of the reaction tube to an appropriate level, a heater for heating the substrate, a carrier gas feeder for feeding a carrier gas into the reaction tube, a first material gas feeder for feeding a first material gas containing a Group 3 element onto the substrate in the reaction tube, a second material gas feeder for feeding a second material gas containing nitrogen onto the substrate in the reaction tube, and a control unit for controlling the pressure reducing device, heater, carrier gas feeder, first material gas feeder and second material gas feeder, characterized in that the control unit controls the first and second material gas feeders to effect alternately the feeding of the first material gas onto the substrate in the reaction tube and the feeding of the second material gas onto the substrate in the reaction tube, so that the number of moles of the elemental nitrogen contained in the second material gas may have a ratio of 200 or more to the number of moles of the Group 3 element in the first material gas.

According to a still further aspect of this invention, there is provided an apparatus for growing a crystal of a nitride semiconductor, having a reaction tube, a substrate mount for mounting a substrate in the reaction tube, a pressure reducing device for reducing the internal pressure of the reaction tube to an appropriate level, a heater for heating the substrate, a carrier gas feeder for feeding a carrier gas into the reaction tube, a first material gas feeder for feeding a first material gas containing a Group 3 element onto the substrate in the reaction tube, a second material gas feeder for feeding a second material gas containing nitrogen onto the substrate in the reaction tube, and a control unit for controlling the pressure reducing device, heater, carrier gas feeder, first material gas feeder and second material gas feeder, characterized in that the control unit controls the first and second material gas feeders to effect alternately the feeding of the first material gas onto the substrate in the reaction tube and the feeding of the second material gas onto the substrate in the reaction tube, so that the number of moles of the elemental nitrogen contained in the second material gas may have a ratio of 450 or more to the number of moles of the Group 3 element in the first material gas.

According to a still further aspect of this invention, there is provided an apparatus for growing a crystal of a nitride semiconductor, having a reaction tube, a substrate mount for mounting a substrate in the reaction tube, a pressure reducing device for reducing the internal pressure of the reaction tube to an appropriate level, a heater for heating the substrate, a carrier gas feeder for feeding a carrier gas into the reaction tube, a first material gas feeder for feeding a first material gas containing a Group 3 element onto the substrate in the reaction tube, a second material gas feeder for feeding a second material gas containing nitrogen onto the substrate in the reaction tube, and a control unit for controlling the pressure reducing device, heater, carrier gas feeder, first material gas feeder and second material gas feeder, characterized in that the control unit controls the first and second material gas feeders to effect alternately the feeding of the first material gas onto the substrate in the reaction tube and the feeding of the second material gas onto the substrate in the reaction tube, so that the number of moles of the elemental nitrogen contained in the second material gas may have a ratio of 200 or more to the number of moles of the Group 3 element in the first material gas until the film thickness of the nitride semiconductor crystal deposited on the substrate reaches the critical film thickness, while the number of moles of the elemental nitrogen contained in the second material gas has a ratio of less than 200 to the number of moles of the Group 3 element in the first material gas when the film thickness is equal to, or over the critical film thickness.

According to a still further aspect of this invention, there is provided an apparatus for growing a crystal of a nitride semiconductor, having a reaction tube, a substrate mount for mounting a substrate in the reaction tube, a pressure reducing device for reducing the internal pressure of the reaction tube to an appropriate level, a heater for heating the substrate, a carrier gas feeder for feeding a carrier gas into the reaction tube, a first material gas feeder for feeding a first material gas containing a Group 3 element onto the substrate in the reaction tube, a second material gas feeder for feeding a second material gas containing nitrogen onto the substrate in the reaction tube, and a control unit for controlling the pressure reducing device, heater, carrier gas feeder, first material gas feeder and second material gas feeder, characterized in that the control unit controls the first and second material gas feeders to effect alternately the feeding of the first material gas onto the substrate in the reaction tube and the feeding of the second material gas onto the substrate in the reaction tube, so that the number of moles of the elemental nitrogen contained in the second material gas may have a ratio of 450 or more to the number of moles of the Group 3 element in the first material gas until the film thickness of the nitride semiconductor crystal deposited on the substrate reaches the critical film thickness, while the number of moles of the elemental nitrogen contained in the second material gas has a ratio of less than 450 to the number of moles of the Group 3 element in the first material gas when the film thickness is equal to, or over the critical film thickness.

According to a still further aspect of this invention, there is provided an apparatus for growing a crystal of a nitride semiconductor, having a reaction tube, a substrate mount for mounting a substrate in the reaction tube, a pressure reducing device for reducing the internal pressure of the reaction tube to an appropriate level, a heater for heating the substrate, a carrier gas feeder for feeding a carrier gas into the reaction tube, a first material gas feeder for feeding a first material gas containing a Group 3 element onto the substrate in the reaction tube, a second material gas feeder for feeding a second material gas containing nitrogen onto the substrate in the reaction tube, and a control unit for controlling the pressure reducing device, heater, carrier gas feeder, first material gas feeder and second material gas feeder, characterized in that the control unit controls the first and second material gas feeders to effect alternately the feeding of the first material gas onto the substrate in the reaction tube and the feeding of the second material gas onto the substrate in the reaction tube, so that the number of moles of the elemental nitrogen contained in the second material gas may have a ratio of more than 250 to the number of moles of the Group 3 element in the first material gas until the film thickness of the nitride semiconductor crystal deposited on the substrate reaches the critical film thickness, while the number of moles of the elemental nitrogen contained in the second material gas has a ratio of from 20 or more to 250 or less to the number of moles of the Group 3 element in the first material gas when the film thickness is equal to, or over the critical film thickness.

According to a still further aspect of the present invention, there is provided an apparatus for growing a crystal of a nitride semiconductor, having a reaction tube, substrate mounting means for mounting a substrate in the reaction tube, pressure reducing means for reducing the internal pressure of the reaction tube to an appropriate level, heating means for heating the substrate, carrier gas feeding means for feeding a carrier gas into the reaction tube, first material gas feeding means for feeding a first material gas containing a Group 3 element onto the substrate in the reaction tube, second material gas feeding means for feeding a second material gas containing nitrogen onto the substrate in the reaction tube, control means for controlling the pressure reducing means, the heating means, the carrier gas feeding means, the first material gas feeding means and the second material gas feeding means, surface flatness measuring means for measuring the surface flatness of the grown crystal, and growth parameter determining means for determining a growth parameter for obtaining best surface flatness from measurements produced by the surface flatness measuring means, characterized in that the control means effects the feeding of the first material gas onto the substrate in the reaction tube and the feeding of the second material gas onto the substrate in the reaction tube alternately, and makes the crystal deposited on the substrate grow until the film thickness of the nitride semiconductor crystal reaches a critical film thickness by variously changing, under a predetermined substrate temperature and a predetermined growth pressure, the ratio of the number of moles of the elemental nitrogen contained in the second material gas relative to the number of moles of the Group 3 element contained in the first material gas, the surface flatness measuring means measures the surface flatness of the grown nitride semiconductor crystal, the growth parameter determining means determines, for bringing the surface flatness to a most appropriate level, a ratio of the number of moles of elemental nitrogen contained in the second material gas relative to the number of moles of the Group 3 element contained in the first material gas, and the control means controls the first material feeding means and the second material gas feeding means such that the ratio of the number of moles of the elemental nitrogen contained in the second material gas relative to the number of moles of the Group 3 element contained in the first material gas is shifted to a value determined by the growth parameter determining means.

According to a still further aspect of the present invention, there is provided an apparatus for growing a crystal of a nitride semiconductor, having a reaction tube, substrate mounting means for mounting a substrate in the reaction tube, pressure reducing means for reducing the internal pressure of the reaction tube to an appropriate level, heating means for heating the substrate, carrier gas feeding means for feeding a carrier gas into the reaction tube, first material gas feeding means for feeding a first material gas containing a Group 3 element onto the substrate in the reaction tube, second material gas feeding means for feeding a second material gas containing nitrogen onto the substrate in the reaction tube, control means for controlling the pressure reducing means, the heating means, the carrier gas feeding means, the first material gas feeding means and the second material gas feeding means, surface flatness measuring means for measuring the surface flatness of the grown crystal, and growth parameter determining means for determining a growth parameter for obtaining best surface flatness from measurements produced by the surface flatness measuring means, characterized in that the control means effects the feeding of the first material gas onto the substrate in the reaction tube and the feeding of the second material gas onto the substrate in the reaction tube alternately, and makes the nitride semiconductor crystal deposited on the substrate grow until the film thickness of the same crystal reaches a critical film thickness, by variously changing, under a predetermined substrate temperature and a predetermined growth pressure, the ratio of the number of moles of the elemental nitrogen contained in the second material gas relative to the number of moles of the Group 3 element contained in the first material gas, the surface flatness measuring means measures the surface flatness of the grown nitride semiconductor crystal, the growth parameter determining means determines, for bringing the surface flatness to a most appropriate level, a first ratio of the number of moles of the elemental nitrogen contained in the second material gas relative to the number of moles of the Group 3 element contained in the first material gas, the control means makes the nitride semiconductor crystal deposited on the substrate grow until the same crystal grows thicker than the critical film thickness by variously changing, under a predetermined substrate temperature and a predetermined growth pressure, the ratio of the number of moles of the elemental nitrogen contained in the second material gas relative to the number of moles of the Group 3 element contained in the first material gas, the surface flatness measuring means measures the surface flatness of the grown nitride semiconductor crystal, and the growth parameter determining means determines, for bringing the surface flatness to a most appropriate level, a second ratio of the number of moles of the elemental nitrogen contained in the second material gas relative to the number of moles of the Group 3 element contained in the first material gas, whereby the first and second material gas feeding means are controlled such that until the film thickness of the nitride semiconductor crystal deposited on the substrate reaches the critical film thickness, the ratio of the number of moles of the elemental nitrogen contained in the second material gas relative to the number of moles of the Group 3 element contained in the first material gas is set at the first ratio determined by the growth parameter determining means and at the second ratio determined by the growth parameter determining means after the film thickness is grown thicker than the critical film thickness.

According to a still further aspect of this invention, there is provided a program for controlling an apparatus for growing a crystal of a nitride semiconductor, characterized in that the program for enabling a computer for controlling the apparatus for growing a crystal of a nitride semiconductor to perform crystal growth includes a procedure for having carried out alternately the procedure of having a first material gas feeding means feed a first material gas containing a Group 3 element onto a substrate in a reaction tube and the procedure of having a second material gas feeding means feed a second material gas containing elemental nitrogen onto the substrate in the reaction tube, and controls them so that the number of moles of the elemental nitrogen contained in the second material gas may have a ratio of 200 or more to the number of moles of the Group 3 element in the first material gas.

According to a still further aspect of this invention, there is provided a program for controlling an apparatus for growing a crystal of a nitride semiconductor, characterized in that the program for enabling a computer for controlling the apparatus for growing a crystal of a nitride semiconductor to perform crystal growth includes a procedure for having carried out alternately the procedure of having a first material gas feeding means feed a first material gas containing a Group 3 element onto a substrate in a reaction tube and the procedure of having a second material gas feeding means feed a second material gas containing elemental nitrogen onto the substrate in the reaction tube, and controls them so that the number of moles of the elemental nitrogen contained in the second material gas may have a ratio of 450 or more to the number of moles of the Group 3 element in the first material gas.

According to a still further aspect of this invention, there is provided a program for controlling an apparatus for growing a crystal of a nitride semi-conductor, characterized in that the program for enabling a computer for controlling the apparatus for growing a crystal of a nitride semiconductor to perform crystal growth includes a procedure for having carried out alternately the procedure of having a first material gas feeding means feed a first material gas containing a Group 3 element onto a substrate in a reaction tube and the procedure of having a second material gas feeding means feed a second material gas containing elemental nitrogen onto the substrate in the reaction tube, and controls them so that the number of moles of the elemental nitrogen contained in the second material gas may have a ratio of 200 or more to the number of moles of the Group 3 element in the first material gas until the film thickness of the nitride semiconductor crystal deposited on the substrate reaches the critical film thickness, while the number of moles of the elemental nitrogen contained in the second material gas has a ratio of less than 200 to the number of moles of the Group 3 element in the first material gas when the film thickness is equal to, or over the critical film thickness.

According to a still further aspect of this invention, there is provided a program for controlling an apparatus for growing a crystal of a nitride semiconductor, characterized in that the program for enabling a computer for controlling the apparatus for growing a crystal of a nitride semiconductor to perform crystal growth includes a procedure for having carried out alternately the procedure of having a first material gas feeding means feed a first material gas containing a Group 3 element onto a substrate in a reaction tube and the procedure of having a second material gas feeding means feed a second material gas containing elemental nitrogen onto the substrate in the reaction tube, and controls them so that the number of moles of the elemental nitrogen contained in the second material gas may have a ratio of 450 or more to the number of moles of the Group 3 element in the first material gas until the film thickness of the nitride semiconductor crystal deposited on the substrate reaches the critical film thickness, while the number of moles of the elemental nitrogen contained in the second material gas has a ratio of less than 450 to the number of moles of the Group 3 element in the first material gas when the film thickness is equal to, or over the critical film thickness.

According to a still further aspect of this invention, there is provided a program for controlling an apparatus for growing a crystal of a nitride semiconductor, characterized in that the program for enabling a computer for controlling the apparatus for growing a crystal of a nitride semiconductor to perform crystal growth includes a procedure for having carried out alternately the procedure of having a first material gas feeding means feed a first material gas containing a Group 3 element onto a substrate in a reaction tube and the procedure of having a second material gas feeding means feed a second material gas containing elemental nitrogen onto the substrate in the reaction tube, and controls them so that the number of moles of the elemental nitrogen contained in the second material gas may have a ratio of 250 or more to the number of moles of the Group 3 element in the first material gas until the film thickness of the nitride semiconductor crystal deposited on the substrate reaches the critical film thickness, while the number of moles of the elemental nitrogen contained in the second material gas has a ratio of from 20 or more to 250 or less to the number of moles of the Group 3 element in the first material gas when the film thickness is equal to, or over the critical film thickness.

According to a still further aspect of the present invention, there is provided a program for controlling an apparatus for growing a crystal of a nitride semiconductor, characterized in that the program for enabling a computer for controlling the apparatus for growing a crystal of a nitride semiconductor to perform crystal growth includes: a procedure for having carried out alternately the procedure of having a first material gas feeding means feed a first material gas containing a Group 3 element onto a substrate in a reaction tube and the procedure of having a second material gas feeding means feed a second material gas containing elemental nitrogen onto the substrate in the reaction tube; a procedure for growing the nitride semiconductor crystal deposited on the substrate until a film thickness of the semiconductor crystal reaches a critical film thickness by variously changing, under a predetermined substrate temperature and a predetermined growth pressure, a ratio of the number of moles of the elemental nitrogen contained in the second material gas relative to the number of moles of the Group 3 element contained in the first material gas; a procedure for measuring the surface flatness of the grown nitride semiconductor crystal; a procedure for determining, for bringing the surface flatness to a most appropriate level, an optimum ratio of the number of moles of the elemental nitrogen contained in the second material gas relative to the number of moles of the Group 3 element contained in the first material gas; and a procedure for shifting the ratio of the number of moles of the elemental nitrogen contained in the second material gas relative to the number of moles of the Group 3 element contained in the first material gas, to a value determined by the optimum ratio determining procedure.

According to a still further aspect of the present invention, there is provided a program for controlling an apparatus for growing a crystal of a nitride semiconductor, characterized in that the program for enabling a computer for controlling the apparatus for growing a crystal of a nitride semi-conductor to perform crystal growth includes: a procedure for having carried out alternately the procedure of having a first material gas feeding means feed a first material gas containing a Group 3 element onto a substrate in a reaction tube and the procedure of having a second material gas feeding means feed a second material gas containing elemental nitrogen onto the substrate in the reaction tube; a procedure for growing the nitride semiconductor crystal deposited on the substrate until a film thickness of the semiconductor crystal reaches a critical film thickness by variously changing, under a predetermined substrate temperature and a predetermined growth pressure, a ratio of the number of moles of the elemental nitrogen contained in the second material gas relative to the number of moles of the Group 3 element contained in the first material gas; a procedure for measuring the surface flatness of the grown nitride semiconductor crystal; a procedure for determining, for bringing the surface flatness to a most appropriate level, a first optimum ratio of the number of moles of the elemental nitrogen contained in the second material gas relative to the number of moles of the Group 3 element contained in the first material gas; a procedure for growing the nitride semiconductor crystal deposited on the substrate until the semiconductor crystal grows thicker than a critical film thickness by variously changing, under a predetermined substrate temperature and a predetermined growth pressure, the ratio of the number of moles of the elemental nitrogen contained in the second material gas relative to the number of moles of the Group 3 element contained in the first material gas; a procedure for measuring the surface flatness of the nitride semiconductor crystal grown thicker than the critical film thickness; and a procedure for determining, for bringing the surface flatness to a most appropriate level, a second optimum ratio of the number of moles of the elemental nitrogen contained in the second material gas relative to the number of moles of the Group 3 element contained in the first material gas, whereby the ratio of the number of moles of the elemental nitrogen contained in the second material gas relative to the number of moles of the Group 3 element contained in the first material gas is set at a value corresponding to the first optimum ratio until the film thickness of the nitride semiconductor crystal deposited on the substrate reaches the critical film thickness, and at a value corresponding to the second optimum ratio after the semiconductor crystal is grown thicker than the critical film thickness.

BRIEF DESCRIPTION OF THE DRAWINGS

Preferred embodiments of this invention will now be described with reference to the accompanying drawings.

BEST MODE FOR CARRYING OUT THE INVENTION

Figure 1:
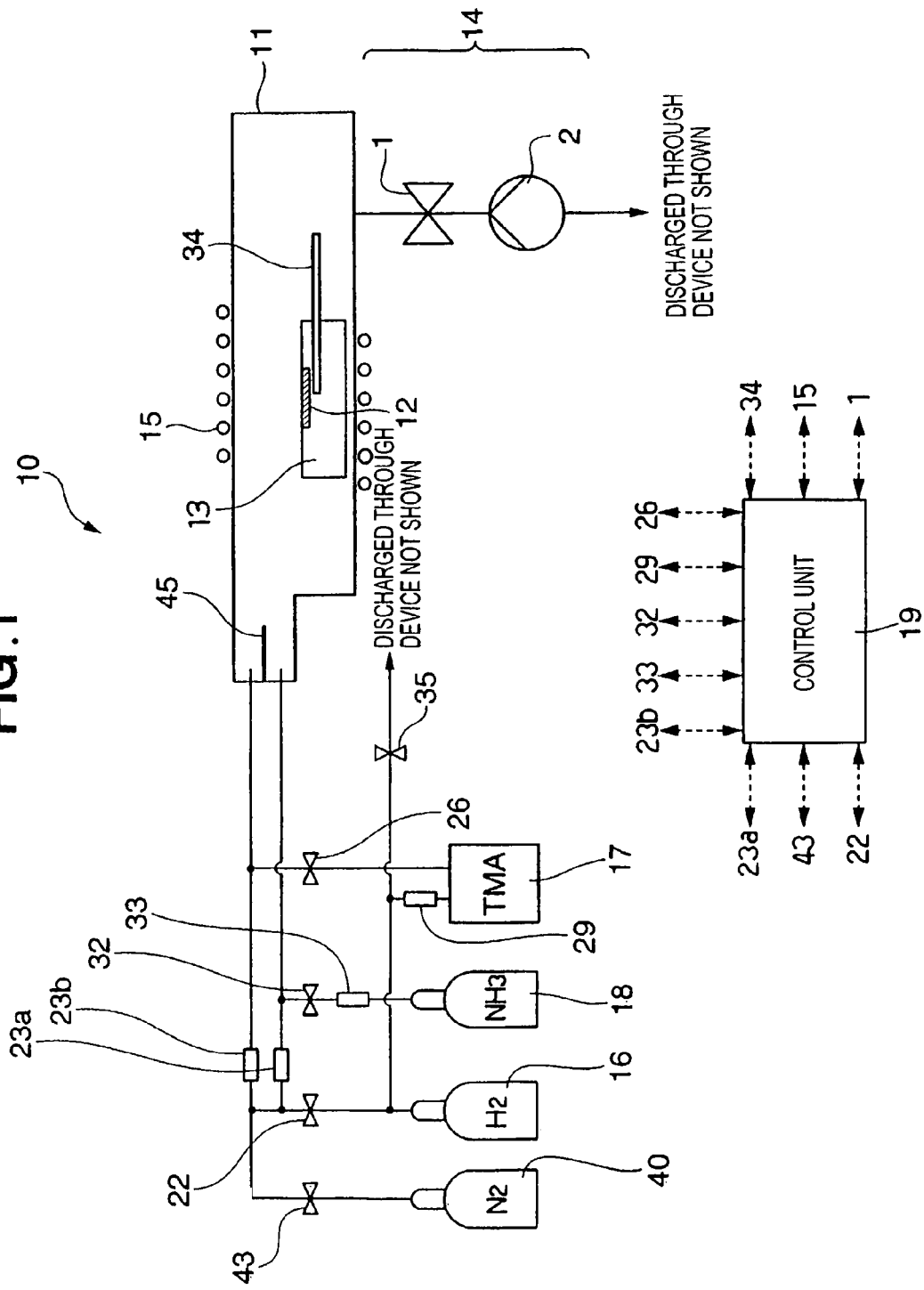
FIG. 1 is a schematic diagram of an apparatus for growing a crystal of a nitride semiconductor according to a first embodiment of this invention.

Referring first to FIG. 1, an apparatus 10 for the growth of a crystal of a nitride semiconductor is an apparatus for epitaxial growth, and a horizontal organic metal vapor-phase epitaxy apparatus in which a reduced pressure horizontal MOVPE (organic metal vapor-phase epitaxy) method is carried out by causing material gases to flow horizontally relative to the surface of an SiC substrate below an atmospheric pressure.

The crystal growing apparatus 10 has a reaction tube 11, a susceptor (substrate mount) 13 for mounting a substrate 12 in the reaction tube 11, a pressure reducing device (evacuation device) 14 for reducing the internal pressure of the reaction tube 11 and a heater 15 for heating the substrate 12. The crystal growing apparatus 10 also has a carrier gas feeder 16 for feeding carrier gas ($H_2$) into the reaction tube 11, a first material gas feeder 17 for feeding a first material gas containing a Group 3 element like aluminum, such as trimethylaluminum (($CH_3)_3AlN$), onto the substrate 12 in the reaction tube 11 and a second material gas feeder 18 for feeding a second material gas containing nitrogen as a Group 5 element, such as ammonia ($NH_3$), onto the substrate 12 in the reaction tube 11. Moreover, the crystal growing apparatus 10 has a control unit 19 for controlling the pressure reducing device 14, heater 15, carrier gas feeder 16, first material gas feeder 17, second material gas feeder 18, etc. The crystal growing apparatus 10 also has a purge gas feeder 40 for $N_2$ gas.

A mass flow controller 23a controls the flow rate of the purge gas, a mass flow controller 23b controls the flow rate of the carrier gas and mass flow controllers 29 and 33 control the flow rates of the first and second material gases, respectively. Valves 22, 26, 32 and 43 perform the on-off control of the relevant gases, respectively. The mass flow controllers 23a, 23b, 29 and 33 and the valves 22, 26, 32 and 43 are controlled by the control unit 19. A baffle plate 45 is provided in the reaction tube 11 for guiding $NH_3$ and trimethylaluminum (TMA), the gases to be fed, onto the substrate 12. The pressure reducing device 14 is composed of a pressure control valve 1 and a pump 2. The pressure control valve 1 is controlled by the control unit 19. A valve 35 is provided in a pipeline for discharging gas from the carrier gas feeder 16 through a device not shown.

The control unit 19 can control the various devices in accordance with an internally stored program by acquiring and storing various parameters. While the feeding of the first material gas and the feeding of the second material gas are effected alternately after the substrate 12 is placed in the reaction tube 11, the control unit 19 according to this invention controls the valves 26 and 32, the mass flow controllers 29 and 33, etc. so that the number of moles of the elemental nitrogen contained in the second material gas may, as a rule, have a ratio of 200 or more to the number of moles of the Group 3 element in the first material gas. Symbol 34 denotes a temperature sensor for measuring the substrate temperature, such as a thermocouple. The control unit 19 may operate in accordance with a control program stored in a memory therein, or may alternatively be supplied with a control program in the form of a storage medium, such as CD-ROM, when required.

The reaction tube 11 is surrounded by cooling water, so that only its middle portion around the substrate 12 may have its temperature raised by the heater 15 of the induction heating type. The susceptor 13 has a concavity in which the substrate 12 is so placed as to be flush therewith. Accordingly, the material gases which are fed flow in a layered stream on the substrate 12 without being disturbed, and the accuracy of the gas reaction control on the substrate 12 can be improved.

Description will now be made of a process for growing a crystal of a nitride semiconductor by using the crystal growing apparatus 10 as described.

According to the first embodiment of this invention, it is a process for growing a crystal of a nitride semiconductor in which after the step of placing the substrate 12 in the reaction tube 11, the step of feeding a first material gas containing a Group 3 element onto the substrate 12 in the reaction tube 11 and the step of feeding a second material gas containing elemental nitrogen thereto are performed alternately to deposit a nitride semiconductor crystal directly on the substrate (alternate feeding method), wherein the number of moles of the elemental nitrogen contained in the second material gas has a ratio of 200 or more to the number of moles of the Group 3 element in the first material gas.

The substrate 12 is a silicon carbide (SiC) substrate and an SiC substrate having an inclination of 0° to 8° from the (0001) Si plane in the direction of <11-20>. This enables a good deposition of an overlying layer (owing to the characteristics of crystallinity). The use of silicon carbide for the substrate advantageously makes it possible to reduce the defect density due to lattice mismatch occurring in the interface of a heterojunction, since the difference in lattice constant is smaller between silicon carbide and a nitride semiconductor than between sapphire and a nitride semiconductor.

According to this embodiment, the nitride semiconductor layer is of AlN. It has a thickness of 4 nm or less (equal to, or less than the critical film thickness) and is epitaxially grown on the substrate directly. The AlN layer has the properties as stated below. (1) The AlN layer is a nitride semiconductor material closest to an SiC crystal in lattice constant, except a mixed crystal semiconductor. If its thickness is so controlled as not to exceed the critical film thickness, it is possible to minimize the defect density due to lattice mismatch occurring in the interface of a hetero-junction. (2) AlN has a band gap of as large as 6.2 eV and is highly insulating, but if its thickness does not exceed the critical film thickness, it does not affect the characteristics of the heterojunction interface, as the tunnel phenomenon of electrons ensures electrical conductivity. (3) The epitaxial growth of AlN on the SiC substrate directly by the alternate feeding method is expected to form an epitaxial layer structure of AlN having a regular crystal structure on the SiC substrate from the initial stage of growth and realize a heterojunction having litter defects and a flat AlN surface by suppressing growth in an island pattern.

According to this embodiment, the baffle plate 45 divides the gas inlet portion of the reaction tube 11 through which the two kinds of material gases are alternately fed to the substrate 12, so that it may be possible to prevent any unevenness in the growth of a nitride semiconductor region from being caused by an intermediate reaction of the material gases ahead of the substrate 12. According to this embodiment, the two kinds of material gases are fed alternately, instead of being fed simultaneously, while they are guided to the substrate 12 by the baffle plate 45, and therefore, the material gases are prevented from undergoing any intermediate reaction ahead of the substrate 12 and the nitride semiconductor growing region is formed in layers and not in islands. According to this embodiment, therefore, a very flat epitaxial layer can be obtained.

As to the material gases, trimethylaluminum (TMA: ($CH_3)_3Al$) is used as a raw material for Al (Group 3 gas). Ammonia $NH_3$ is used as a raw material for N (Group 5 gas), and hydrogen $H_2$ is used as gas carrying the material gases (carrier gas). The numbers of moles as converted from the flow rates at room temperature and atmospheric pressure are employed as the amounts in which the material gases for growing the AlN crystal, TMA and $NH_3$, are fed. (They are the numbers of moles which are fed in unit time.) The 5/3 ratio is the ratio of the number of moles of the material gases as calculated in the way stated above.

Figure 2:
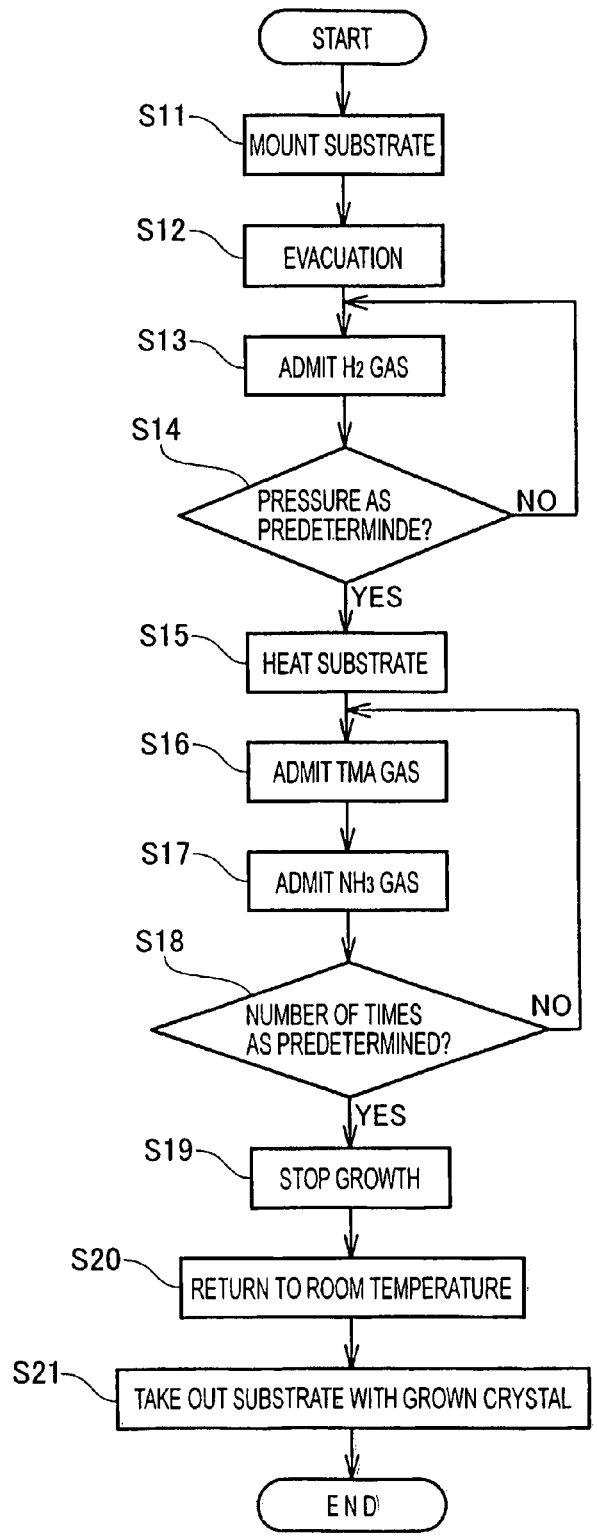
FIG. 2 is a flowchart showing the procedures for crystal growth conforming to a control program stored in a control apparatus for the apparatus for growing a crystal of a nitride semiconductor according to the first embodiment of this invention.

The steps of crystal growth according to the control program stored in the control unit 19 for the crystal growing apparatus 10 will now be described by the flowchart shown in FIG. 2. The control program for crystal growth is a program for performing crystal growth with a thickness not exceeding the critical film thickness. The parameters for crystal growth are (1) substrate temperature: temperature of the SiC substrate when the crystal, is grown, (2) growth pressure: internal pressure of the reaction tube when the crystal is grown, (3) growth time: time from the beginning of growth by the simultaneous feeding method to its end, (4) feeding time: feeding time for each of material gases, $NH_3$ and TMA, when they are alternately fed, (5) growth cycle: number of times of alternate feeding, (6) 5/3 ratio: ratio of the numbers of moles of the material gases fed for AlN, as calculated in the way stated above, and (7) amount of gas flow: sum of the amounts of flow of TMA, $NH_3$ and carrier gas when the crystal is grown.

The above parameters are inputted to the control unit 19. The operator mounts an SiC substrate on the susceptor 13 in the crystal growing apparatus 10 (Step S1). The valves 22, 26, 32 and 43 remain closed. Then, the control unit 19 is operated. As a result, the process is started by the control program. After the process has been started, the evacuating device 14 is operated for the vacuum evacuation of the reaction tube (Step S12). The valve 22 is opened to admit $H_2$ gas (Step S13). Judgment is made as to if a predetermined pressure has been reached (Step S14), and if a predetermined pressure has been reached, the heater 15 is operated to heat the substrate 12 (Step S15). When a predetermined temperature has been reached, crystal growth is started. Preanneal is done prior to crystal growth, if required. The valve 26 is opened to let TMA gas flow (Step S16), then the valve 26 is closed and the valve 32 is opened to let $NH_3$ flow (Step S17). Judgment is made as to if Steps S16 and S17 have been repeated a predetermined number of times (Step S18). The predetermined number of times may, for example, be six times. When the predetermined number of times has been completed, the crystal growth is terminated (Step S19). While $H_2$ and $NH_3$ are kept flowing, the heater 15 is stopped and after its temperature has been lowered to a predetermined level, the reaction tube is purged with $N_2$ gas and allowed to return to room temperature (Step S20). The evacuating device 14 is stopped and when a normal pressure has been restored, the substrate with the grown crystal is taken out (Step S21).

A nitride semiconductor crystal of good flatness and high quality can be obtained by the process as described above. According to the alternate feeding method as described, aluminum first adheres to the SiC substrate in finely divided liquid droplets owing to the substrate temperature higher than its melting point and the relation in surface energy of SiC and aluminum. Then, ammonia is fed, and elemental nitrogen as dissolved therefrom is adsorbed to the SiC surface and alters its surface energy, so that aluminum spreads from the liquid droplets uniformly over the SiC surface carrying N. As a result, an AlN film is formed. When they are alternately repeated, it is apparently possible to form a uniformly spread and flat AlN crystal on SiC. Accordingly, it is possible to obtain a nitride semiconductor crystal of good flatness and high quality.

The control unit 19 makes it possible to form flat and high-quality AlN by controlling the first material gas feeder 17 and the second material gas feeder 18 so that the number of times that the feeding of the first material gas onto the substrate 12 in the reaction tube 11 and the feeding of the second material gas onto the substrate 12 in the reaction tube 11 are performed alternately may, as a rule, be from one or more times to 10 or less times. The number of times of alternate feeding has to be appropriately selected from the number of times enabling a desired film thickness to be obtained in accordance with various growth parameters, etc. In order to form an AlN layer with or over the critical film thickness, it is necessary to alter the growth parameters to maintain the flatness of the grown layer and repeat alternate gas feeding until the film thickness as required is reached.

The second embodiment will now be described. The second embodiment employs the same apparatus as the crystal growing apparatus 10 employed by the first embodiment, except that it employs a different control program for the control unit 19. Accordingly, description will be made of the control program alone, and not of any structural features of the apparatus. In accordance with this embodiment, crystal growth is performed with or over the critical film thickness.

The control unit 19 controls the first and second material gas feeders to mount the substrate 12 in the reaction tube 11 before effecting alternately the feeding of the first material gas onto the substrate 12 in the reaction tube 11 and the feeding of the second material gas onto the substrate 12 in the reaction tube 11, so that the number of moles of the elemental nitrogen contained in the second material gas may have a ratio of 450 or more to the number of moles of the Group 3 element in the first material gas until the film thickness of the nitride semiconductor crystal deposited on the substrate 12 reaches the critical film thickness, while the number of moles of the elemental nitrogen contained in the second material gas has a ratio of from 20 or more to 250 or less to the number of moles of the Group 3 element in the first material gas when the film thickness is equal to, or over the critical film thickness.

Figure 3:
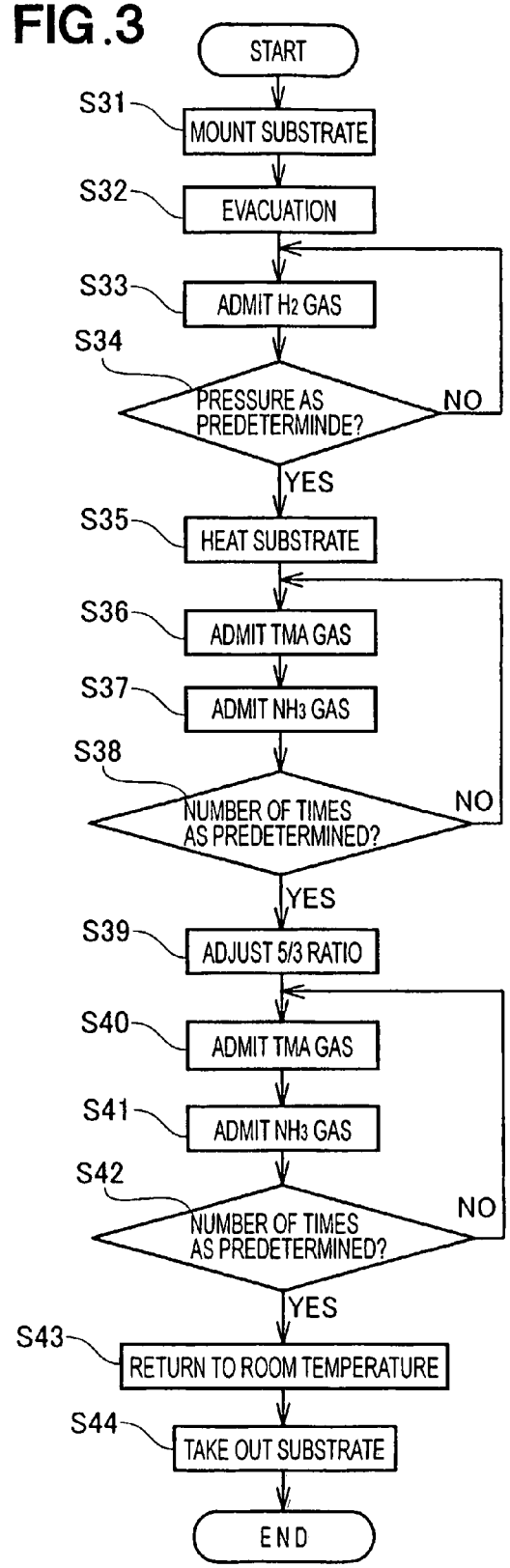
FIG. 3 is a flowchart showing the procedures for crystal growth conforming to a control program stored in a control apparatus for the apparatus for growing a crystal of a nitride semiconductor according to a second embodiment of this invention.

FIG. 3 is a flowchart of the control program stored in the control unit 19. This control program for performing crystal growth is a program for performing crystal growth with or over the critical film thickness. The parameters are inputted to the control unit 19. The operator mounts an SiC substrate on the susceptor 13 in the crystal growing apparatus 10 (Step S31). The valves 22, 26, 32 and 43 remain closed. Then, the control unit 19 is operated. As a result, the process is started by, the control program. After it has been started, the evacuating device 14 is operated for the vacuum evacuation of the reaction tube 11 (Step S32). The valve 22 is opened to admit $H_2$ gas (Step S33). Judgment is made as to if a predetermined pressure has been reached (Step S34). If the predetermined pressure has been reached, the heater 15 is operated to heat the substrate 12 (Step S35). When a predetermined temperature has been reached, crystal growth is started. The mass flow controllers 29 and 33 are adjusted for the first 5/3 ratio (450 or more) and the valve 26 is opened to let TMA gas flow (Step S36), then the valve 26 is closed and the valve 32 is opened to let $NH_3$ flow (Step S37). This is repeated a predetermined number of times (for example, six times) until the critical film thickness is reached. Judgment is made as to if the predetermined number of times has been completed (Step S38). When the predetermined number of times has been completed, the mass flow controllers 29 and 33 are adjusted for the second 5/3 ratio (from 20 or more to 250 or less) (Step S39) and the valve 26 is opened to let TMA gas flow (Step S40), then the valve 26 is closed and the valve 32 is opened to let $NH_3$ flow (Step S41). Judgment is made as to if Steps S40 and S41 have been repeated a predetermined number of times (Step S42). The predetermined number of times may, for example, be 500 times and depend on the crystal film thickness as required that is equal to, or larger than the critical film thickness. When judgment has shown at Step S42 that the predetermined number of times has been completed, the crystal growth is terminated, and while $H_2$ and $NH_3$ are kept flowing, the heater 15 is stopped and when the temperature has been lowered to a predetermined level, the feeding of $H_2$ and $NH_3$ is stopped and $N_2$ gas is let to flow to restore room temperature (Step S43). The evacuating device 14 is stopped and when a normal pressure has been restored, the substrate with the grown crystal is taken out (Step S44).

A nitride semiconductor crystal of good flatness and high quality can be obtained by the process as described above. According to the alternate feeding method as described, aluminum first adheres to the SiC substrate in finely divided liquid droplets owing to the substrate temperature higher than its melting point and the relation in surface energy of SiC and aluminum. Then, ammonia is fed, and elemental nitrogen as dissolved therefrom is adsorbed to the SiC surface and alters its surface energy, so that aluminum spreads from the liquid droplets uniformly over the SiC surface carrying N. As a result, an AlN film is formed. When they are alternately repeated, it is apparently possible to form a uniformly spread and flat AlN crystal on SiC. Its flatness can be maintained with the critical film thickness and can also be obtained even with a larger thickness. Accordingly, it is possible to obtain a nitride semiconductor crystal of good flatness and high quality. Explanation will be made below of the reasons for the selection of the 5/3 ratio (200, 450 or from 20 or more to 250 or less) for the feed gases and the number of times for the alternate feeding of gases (six or 500 times) as stated in the description of the process flow made with reference to FIGS. 2 and 3.

Explanation will now be made of the grounds for the 5/3 ratio of the feed gases and the number of times for the alternate feeding of gases as stated in the above description of two embodiments. In this connection, four kinds of experiments were conducted. According to a first experiment, the epitaxially grown surfaces of AlN grown directly on SiC substrates by the known simultaneous feeding method and the alternate feeding method according to this invention were compared with each other in flatness to determine the effect of direct growth of AlN in its critical film thickness of 4 nm on an SiC substrate by the alternate feeding method.

The conditions of growth employed for the experiment are shown in Table 1.

TABLE 1

| Parameter for growth | Simultaneous feeding method | Alternate feeding method |
|---|---|---|
| Substrate temperature | 1100° C. < T < 1300° C. | |
| Pressure for growth | <50 kPa | |
| V/III ratio | 200-1800 | |
| Film thickness | <4 nm | |

The experiments for AlN growth were conducted by carrying out the simultaneous and alternate feeding methods under the conditions shown in Table 1. The substrate temperature was set between 1100° C. and 1300° C., the pressure for growth was set below 50 kPa, the 5/3 ratio was set between 200 and 1800 and the alternate feeding was discontinued immediate before the growing crystal film thickness reached the critical film thickness of 4 nm. For example, the 5/3 ratio of 200 to 1800 means that even if the 5/3 ratio was varied between 200 and 1800, the grown crystal surface remained equal in flatness if the other conditions (substrate temperature, pressure for growth and film thickness) remained equal. The same is true with the substrate temperature of 1100° C. to 1300° C., the pressure for growth <50 kpa. The same is also true with the other experiments according to Tables 2 and 3 as will be described later.

Figure 4:
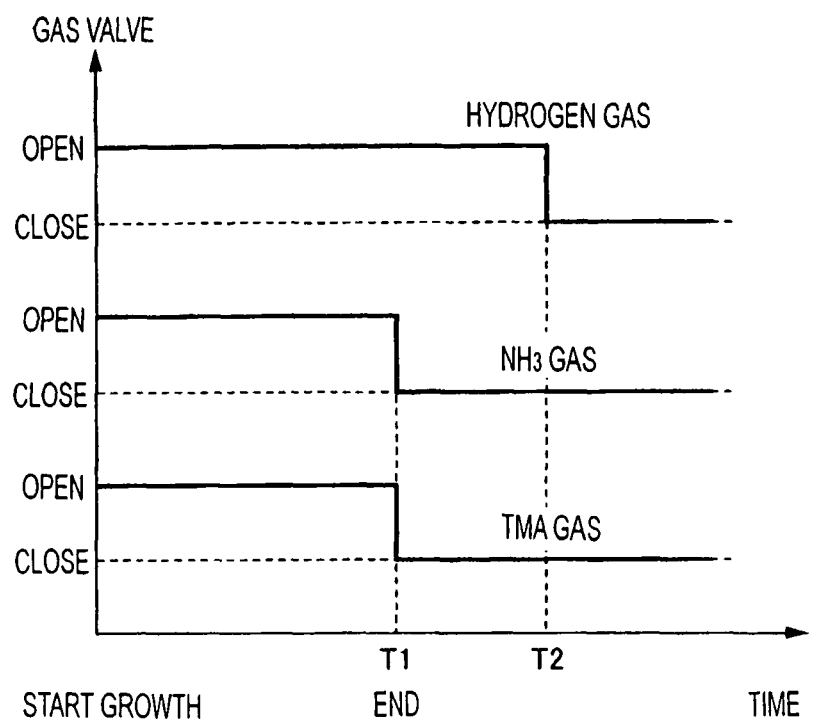
FIG. 4 is a diagram showing a pattern for the opening and closing of valves according to the simultaneous feeding method.

FIG. 4 is a diagram showing a known pattern for the opening and closing of valves for the simultaneous feeding method. The horizontal axis represents time and the vertical axis represents the opening and closing of the gas valves. The valve for carrier gas is kept open to let carrier gas flow into the reaction tube until time T2, and the valves for TMA and ammonia gases are kept open for the length of time T1 to let TMA and ammonia gases into the reaction tube simultaneously to grow the crystal. Time T1 was so selected as to grow a film thickness smaller than 4 nm by that time.

Figure 5:
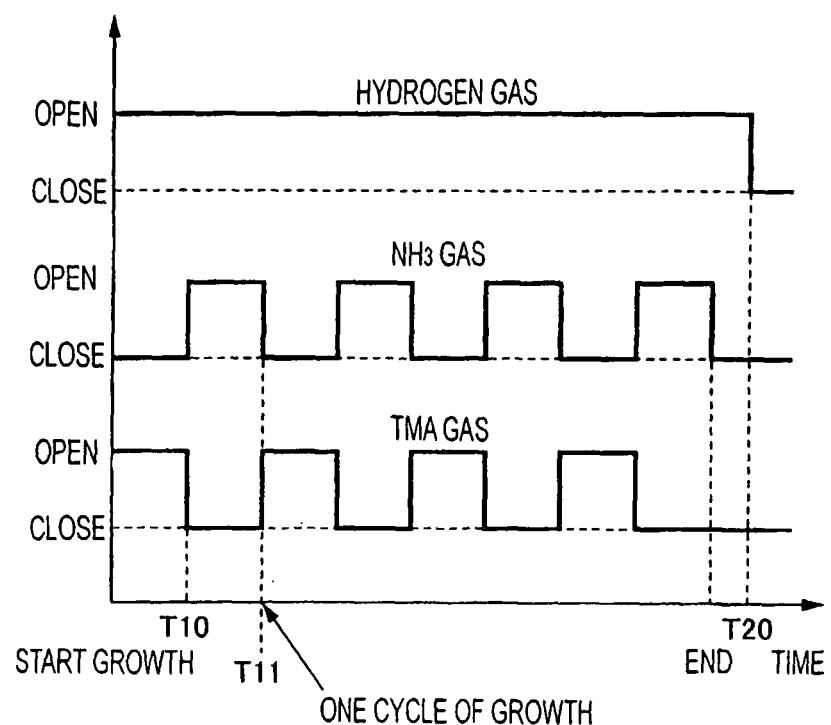
FIG. 5 is a diagram showing a pattern for the opening and closing of valves according to the alternate feeding method.

FIG. 5 is a diagram showing a pattern for the opening and closing of valves for the alternate feeding method according to this invention. While the valve for carrier gas is kept open to let carrier gas into the reaction tube until time T20, a cycle in which the valve for TMA gas is opened with the valve for ammonia gas closed until time T10, while the valve for ammonia gas is opened with the valve for TMA gas closed from time T10 to T11, is repeated a predetermined number of times and stopped at the time of finish to terminate the growth of the crystal. For example, a time of 2 seconds until T10 and a time of 3 seconds from T10 to T11 make one cycle. The flow rates of the gases are, for example, from 1 to 5 slm (standard liters/min.) for $H_2$ gas and from 100 to 250 sccm (standard cubic cm/min.) for TMA when TMA is fed, and from 1 to 5 slm for $H_2$ gas and from 2000 to 5000 sccm for $NH_3$ gas when $NH_3$ is fed. Prior to the crystal growth, preanneal is performed by causing $H_2$ gas to flow at a flow rate of 10 slm (standard liters/min.) or below at a reaction tube pressure of 50 kPa or less and a substrate temperature of 1100° C. to 1300° C. for 5 to 10 minutes. After the crystal growth, $H_2$ gas and $NH_3$ were caused to flow at flow rates of 10 slm and 200 sccm, respectively, to create a pressure of 95 MPa in the reaction tube, while lowering the substrate temperature to 300° C., and the reaction tube was purged with $N_2$ gas to restore the atmospheric pressure, while the substrate temperature was lowered to 100° C. or below.

Although FIG. 5 shows the case in which the time periods in which $NH_3$ and TMA gases are fed do not overlap each other, it will also be possible to feed them alternately in a somewhat overlapping way. It will alternatively be possible to feed them alternately in such a way that there may occur a time period of, say, one to two seconds in which neither gas is fed. In this case, after one of the gases has undergone a thorough reaction on the substrate 12, the other gas will be fed. According to this embodiment, TMA gas is first fed, as shown in FIG. 5. If $NH_3$ is first fed, it is feared that an unnecessary insulating film of SiN may be formed on the SiC substrate 12, and according to this embodiment, TMA gas is first fed to prevent any such inconvenience.

As to a method of evaluating the grown crystal, the epitaxially grown surface was observed through an atomic force microscope (hereinafter AFM) and it was evaluated by an observed image and the values of its centerline average roughness (hereinafter Ra) and n-point average roughness (hereinafter Rz). Smaller values of Ra and Rz indicate a higher level of flatness.

Description will now be made of a second experiment. The second experiment was conducted to clarify the effects which the parameter relating to the 5/3 ratio would have on the epitaxially grown AlN surface when AlN was epitaxially grown in a thickness of about 4 nm on SiC by the alternate feeding method according to this invention. The substrate temperature was set between 1100° C. and 1300° C., the pressure for growth was set below 50 kPa and the growth was terminated immediately before a crystal film thickness of 4 nm was reached (the number of cycles was six), as shown in Table 2.

TABLE 2

2nd experiment

| Parameter for growth | Alternate feeding method |
| --- | --- |
| Substrate temperature | 1100° C. < T < 1300° C. |
| Pressure for growth | <50 kPa |
| V/III ratio | 100-1800 |
| Film thickness | <4 nm (No. of cycles: 6) |

Measurements were made by varying the 5/3 ratio between 100 and 1800. As to a method of evaluating the grown crystal, the epitaxially grown surface was observed through an atomic force microscope (hereinafter AFM) and it was thereafter evaluated by the values of its centerline average roughness (hereinafter Ra) and n-point average roughness (hereinafter Rz).

A third experiment was an experiment for clarifying the flatness of the epitaxially grown AlN surface when AlN was epitaxially grown in a thickness over 4 nm on SiC by the alternate feeding method according to this invention. The conditions for growth as employed for the experiment were the conditions shown in Table 3 and the growth experiment was conducted by varying the number of process cycles from 1 to 20 to effect further crystal growth from AlN having a critical film thickness of about 4 nm on the SiC substrate.

More specifically, the substrate temperature was set between 1100° C. and 1300° C., the pressure for growth was set below 50 kPa, the 5/3 ratio was set at 900 and measurements were made by varying the number of cycles from 1 to 20.

As to a method of evaluating the grown crystal, the epitaxially grown surface was observed through an atomic force microscope (hereinafter AFM) and it was thereafter evaluated by the values of its centerline average roughness (hereinafter Ra) and n-point average roughness (hereinafter Rz).

TABLE 3

3rd experiment

| Parameter for growth | Alternate feeding method |
| --- | --- |
| Substrate temperature | 1100° C. < T < 1300° C. |
| Pressure for growth | <50 kPa |
| V/III ratio | 900 |
| Film thickness | >4 nm (No. of cycles: 1 to 20) |

Figure 6:
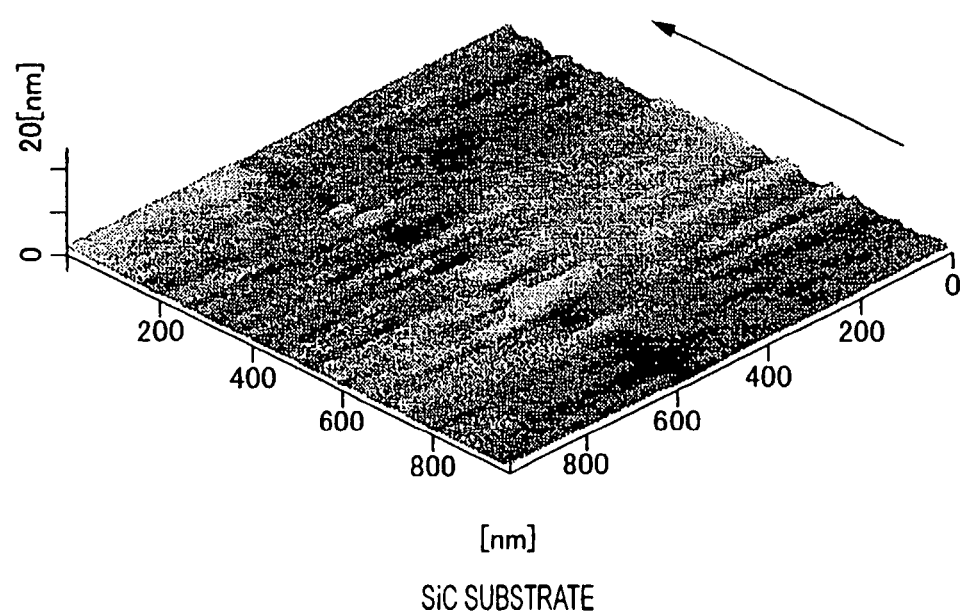
FIG. 6 is a view showing an AFM image of the surface of an SiC substrate.
Figure 7:
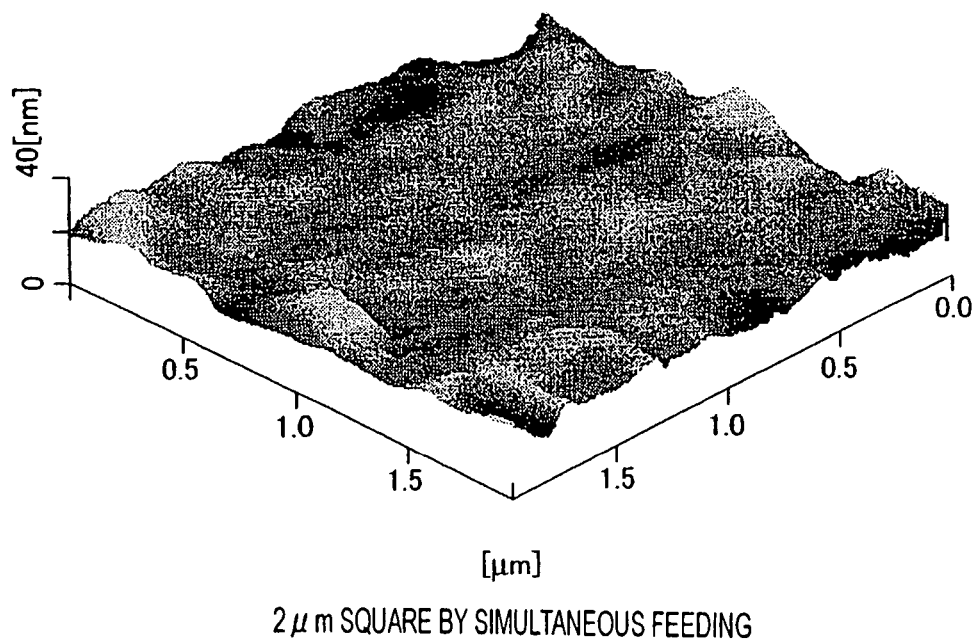
FIG. 7 is a view showing an image obtained by the AFM observation of the surface of AlN grown epitaxially by the simultaneous feeding method.
Figure 8:
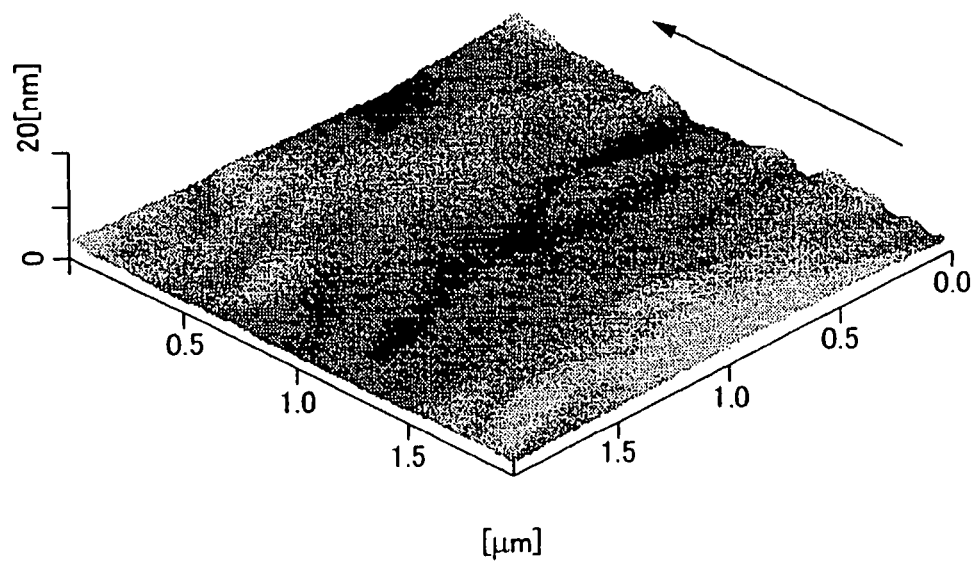
FIG. 8 is a view showing an image obtained by the AFM observation of the surface of AlN grown epitaxially by the alternate feeding method.

FIGS. 6 to 12 show the results of the first to third experiments. FIG. 6 shows an AFM image of the surface of an SiC substrate to which no treatment was given. In the image as observed, there is seen a difference in level due to the inclination of the substrate surface in the direction of an arrow. FIG. 7 shows an AFM image as observed of an AlN surface grown epitaxially by the simultaneous feeding method according to Experiment 1. Ra is 0.7 and Rz is 2.3. The surface has irregularly formed undulations. It is obvious that AlN grew in a pattern of islands during the initial stage of its growth. FIG. 8 shows an AFM observed image of an AlN surface grown epitaxially by the alternate feeding method according to Experiment 1. Ra is 0.3 and Rz is 1.2. It is obvious therefrom that the alternate feeding method forms a surface of better flatness and a heterojunction interface of better characteristics when growing AlN in a thickness of about 4 nm on the SiC substrate. It is obvious therefrom that AlN grows regularly in its surface along the inclination of the SiC substrate.

Figure 9:
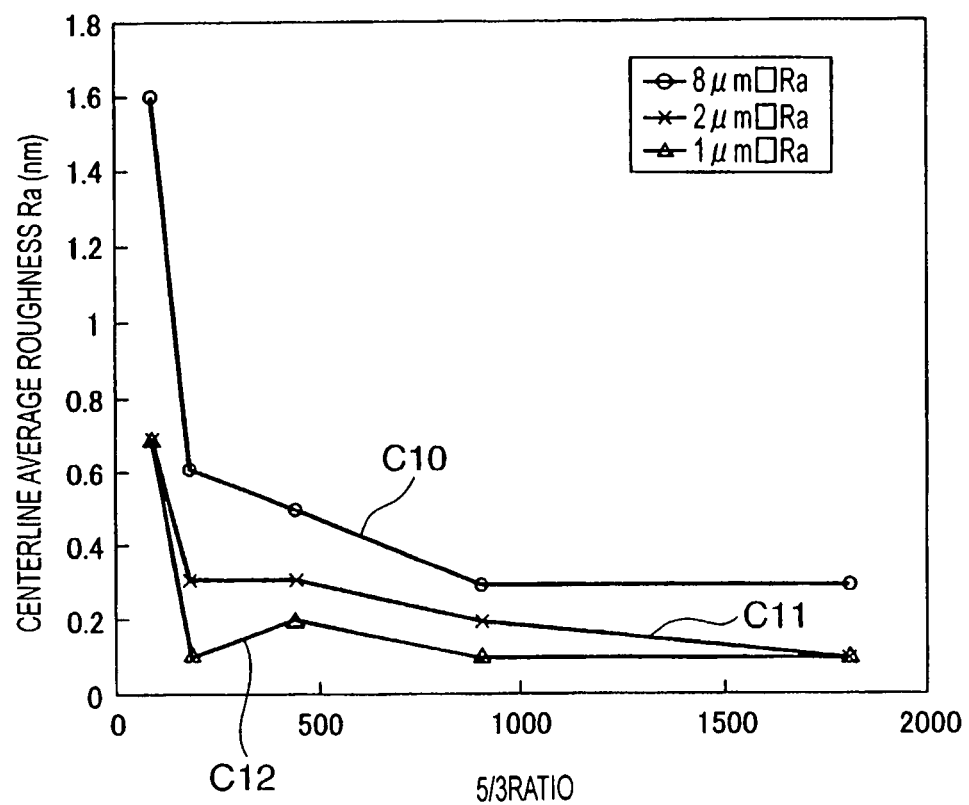
FIG. 9 is a graph showing Ra in relation to the 5/3 ratio in the case of growth by alternate feeding.

FIG. 9 is a graph showing Ra in relation to the 5/3 ratio as employed for growth by alternate feeding according to Experiment 2. The horizontal axis represents the 5/3 ratio and the vertical axis represents Ra. Curve C 10 shows the values as determined within an 8 μm square surface. C11 shows the values as determined within a 2 μm square surface. Curve C12 shows the values as determined within a 1 μm square surface. It is obvious therefrom that Ra decreases with an increase in the 5/3 ratio. It is obvious therefrom that a 5/3 ratio of 200 or above gives an Ra of 0.6 urn or below and thereby a marked improvement in flatness.

Figure 10:
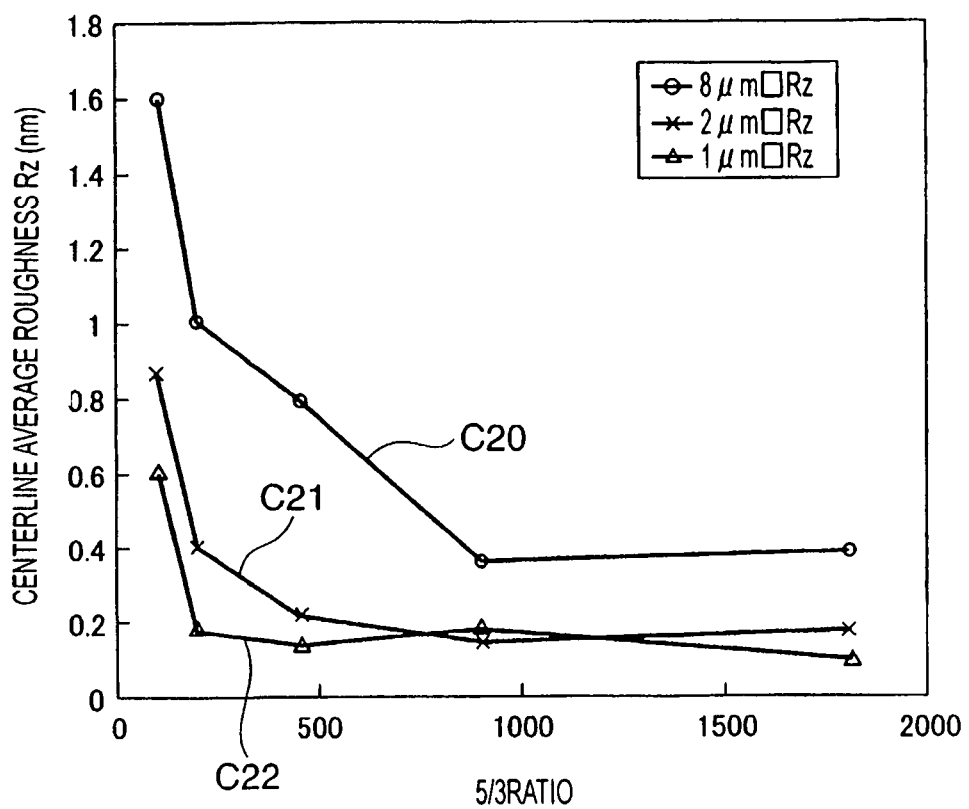
FIG. 10 is a graph showing Rz in relation to the 5/3 ratio in the case of growth by alternate feeding.

FIG. 10 is a graph showing Rz in relation to the 5/3 ratio as employed for growth by alternate feeding according to Experiment 2. The horizontal axis represents the 5/3 ratio and the vertical axis represents Rz. Curve C20 shows the values as determined within an 8 μm square surface. C21 shows the values as determined within a 2 μm square surface. Curve C22 shows the values as determined within a 1 μm square surface. It is obvious therefrom that Rz decreases with an increase in the 5/3 ratio. It is obvious therefrom that a 5/3 ratio of 200 or above gives an Rz of 3 urn or below and thereby a marked improvement in flatness. The applicant's experiments have shown that a 5/3 ratio of 450 or above gives good surface flatness (Ra and Rz) in a still more reliable way (see FIGS. 9 and 10). Even a 5/3 ratio of 1800 maintained good flatness and did not cause any worsening in flatness.

It is, thus, obvious that when growing a nitride semiconductor crystal, it is effective for improved flatness to use the alternate feeding method and employ a high 5/3 ratio (>200) until the critical film thickness is reached.

Figure 11:
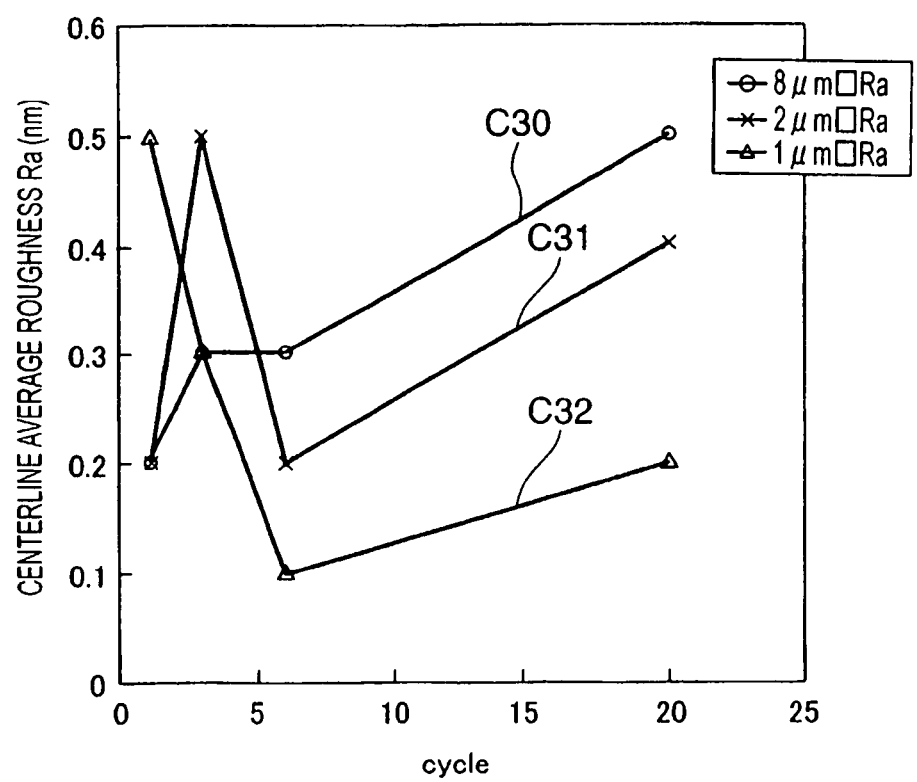
FIG. 11 is a graph showing Ra in relation to the number of cycles in the case of growth by alternate feeding.

FIG. 11 is a graph showing Ra in relation to the number of cycles as employed for growth by alternate feeding according to Experiment 3. The horizontal axis represents the number of cycles and the vertical axis represents Ra. Curve C30 shows the values as determined within an 8 μm square surface. C31 shows the values as determined within a 2 μm square surface. Curve C32 shows the values as determined within a 1 μm square surface. It is obvious therefrom that when the number of cycles is larger than 6, i.e., when the film thickness exceeds the critical film thickness (=6 cycles), Ra increases, even if the 5/3 ratio may remain as high. The conclusion that the critical film thickness was reached by six cycles was derived from the confirmation of definite growth of AlN by the observation of its surface through an atomic force microscope.

Figure 12:
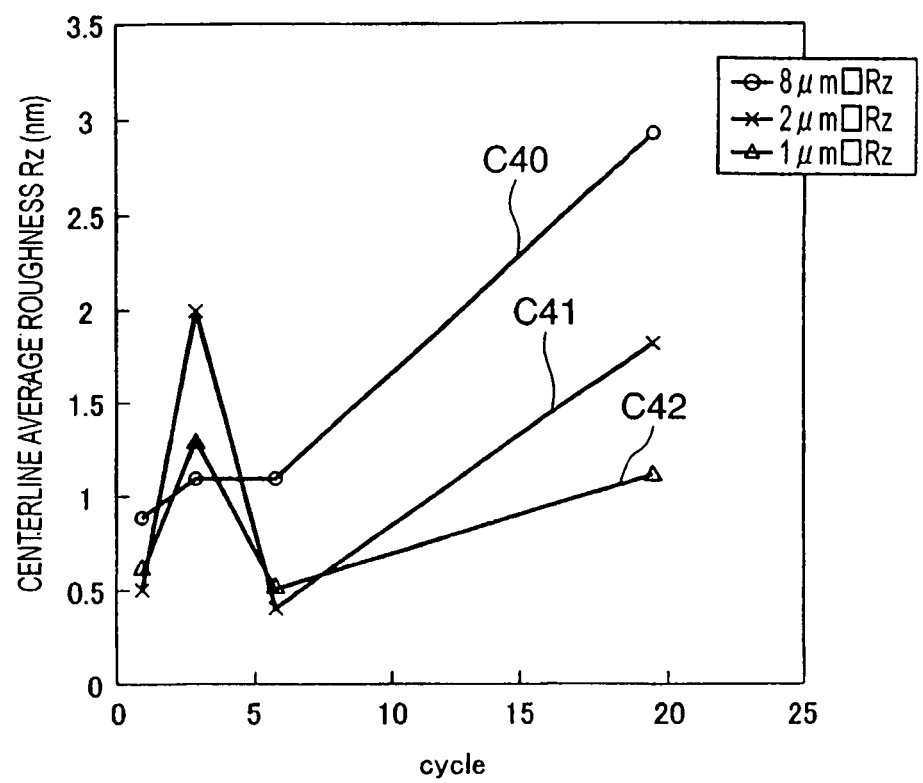
FIG. 12 is a graph showing Rz in relation to the number of cycles in the case of growth by alternate feeding.

FIG. 12 is a graph showing Rz in relation to the number of cycles as employed for growth by alternate feeding according to Experiment 3. The horizontal axis represents the number of cycles and the vertical axis represents Rz. Curve C40 shows the values as determined within an 8 μm square surface. C41 shows the values as determined within a 2 μm square surface. Curve C42 shows the values as determined within a 1 μm square surface. It is obvious therefrom that when the number of cycles is larger than 6, i.e., when the film thickness exceeds the critical film thickness (=6 cycles), Rz increases, even if the 5/3 ratio may remain as high.

Table 4 is a table showing the results of a fourth experiment. The fourth experiment was conducted by growing a crystal until a total AlN film thickness of 60 nm by employing the alternate feeding method under conditions (a) and (b) each. The substrate temperature and the pressure for growth were equal to those shown in Tables 1, 2 and 3. As is obvious from Table 4, a lower 5/3 ratio gives better flatness as shown under condition (b), when the film thickness exceeds the critical AlN film thickness of 4 nm (=6 cycles).

Table 4 also shows the results of an experiment conducted by using the simultaneous feeding method for comparison purposes (the other conditions being equal to those shown in Table 1).

TABLE 4

4th experiment (Total grown AlN layer thickness: 60 nm)

|  | Condition (a) | Condition (b) | Simultaneous feeding* |
|---|---|---|---|
| 5/3 ratio until 4 nm (6 cycles) | 900 | 900 | 250 |
| 5/3 ratio from 4 nm to 60 nm (7 to 500 cycles) | 900 | 100 |  |
| Ra (nm) | 0.6 | 0.3 | 1.1 |

*In the experiment for the epitaxial growth of AlN by the simultaneous feeding method, Ra was of a layer having a thickness of 7 nm.

The data according to the simultaneous feeding method was, however, of a total film thickness up to 7 nm. Although the basic principle of epitaxial growth is that growth proceeds, as information on the underlying crystal surface is transmitted in the direction of growth, the collection of data was limited to data up to 7 nm, since Ra on 7 nm was considered difficult to improve by increasing the film thickness according to the simultaneous feeding method.

As a result of the experiments conducted to determine Ra and Rz in relation to the number of cycles for growth by alternate feeding, it has been found that if the number of cycles is increased beyond six according to the alternate feeding method, i.e., if AlN is epitaxially grown in a thickness exceeding its critical film thickness, its surface begins to be roughened, contrary to the results obtained from a thickness not exceeding the critical film thickness. It has thus been found that when AlN with a thickness exceeding the critical film thickness is epitaxially grown in a flat surface, its flatness is improved over the surface grown by the simultaneous feeding method if it is grown by the alternate feeding method under conditions including a 5/3 ratio as high as 450 or more until a thickness not exceeding the critical film thickness, and under conditions including a lower 5/3 ratio for any thickness exceeding it. The applicant's experiments have shown that good surface flatness (Ra and Rz) can be obtained reliably by employing a 5/3 ratio of from 20 or more to 250 or less when the critical film thickness is exceeded. It is, however, to be noted that an optimum 5/3 ratio should be selected by taking into consideration various other parameters including the substrate temperature, pressure for growth, total film thickness and limited time for crystal growth. According to this invention, it is possible to realize the epitaxial growth of a nitride semiconductor in layers satisfactorily without having the flow of any materials gas disturbed in the vicinity of a heated substrate, since its epitaxial growth is performed by VPE at a reduced pressure.

It should be noted that a reaction similar to the one in making an aluminum nitride (AlN) layer grow epitaxially on an SiC substrate, as described in relation to the above embodiment, is also obtained in making other nitride semiconductor crystals than AlN semiconductor crystals, e.g., semiconductor crystals of gallium nitride (GaN), indium nitride (InN), boron nitride (BN) or combinations thereof, grow on an SiC substrate. Thus, the present invention, in which the 5/3 ratio of alternately fed gas is markedly changed from high (e.g., 5/3 ratio of more than 200) to low (e.g., 5/3 ratio of less than 200) in light of a critical film thickness as a border may be applied without any change to the growth of such other nitride semiconductor crystals on an SiC substrate. The same applies to the case wherein a substrate of sapphire ($Al_2O_3$) with a similar nitride semiconductor crystal and lattice constant is used in place of the SiC substrate.

As can be readily appreciated by a skilled artisan, it is advantageous that a most appropriate growth parameter is determined in advance for forming a particular grown film on a particular substrate and is used in an actual process of growth of a nitride semiconductor crystal. Such a most appropriate growth parameter may be determined by first carrying out a process of crystal growth to a critical film thickness multiple times by variously changing the 5/3 ratio of a fed gas under a predetermined substrate temperature and growth pressure. Then, data as to the surface flatness resulted from the crystal growth processes is obtained. Based on the data, an optimal 5/3 ratio for a predetermined growth parameter is determined. Continuously, a process of crystal growth beyond the critical film thickness is carried out multiple times by variously changing the 5/3 ration of a fed gas under a predetermined substrate temperature and a predetermined growth pressure. Then, data as to the surface flatness resulted from the crystal growth process is obtained. Based on the obtained data, a most appropriate 5/3 ratio for a predetermined growth parameter is determined and this 5/3 ratio may be used in actually growing a semiconductor crystal.

INDUSTRIAL APPLICABILITY

This invention is applicable to an apparatus and a process for growing a nitride semiconductor crystal on a heterogeneous substrate directly.

The invention claimed is:

1. A process for growing a crystal of a nitride semiconductor which comprises:
   the step of mounting a substrate in a reaction tube,
   the step of feeding a first material gas containing a Group 3 element onto the substrate in the reaction tube, and
   the step of feeding a second material gas containing elemental nitrogen onto the substrate in the reaction tube, said feeding steps being carried out alternately to deposit a nitride semiconductor crystal directly on the substrate,
   wherein, the number of moles of the elemental nitrogen contained in the second material gas has a ratio of 200 or more to the number of moles of the Group 3 element in the first material gas until the film thickness of the nitride semiconductor crystal deposited on the substrate reaches a critical film thickness, whereas the number of moles of the elemental nitrogen contained in the second material gas has a ratio of less than 200 to the number of moles of the Group 3 element in the first material gas when the film thickness is equal to, or over the critical film thickness, said critical film thickness defined as the thickness of the film at which dislocations occur.

2. The process for growing a crystal of a nitride semiconductor as set forth in claim 1, wherein the number of times that the step of feeding a first material gas containing a Group 3 element onto the substrate in the reaction tube and the step of feeding a second material gas containing elemental nitrogen onto the substrate in the reaction tube are carried out alternately is from one up to ten times.

3. The process for growing a crystal of a nitride semiconductor as set forth in claim 1, wherein the number of times that the step of feeding a first material gas containing a Group 3 element onto the substrate in the reaction tube and the step of feeding a second material gas containing elemental nitrogen onto the substrate in the reaction tube are carried out alternately is six times.

4. The process for growing a crystal of a nitride semiconductor as set forth in claim 1, wherein the substrate is of silicon carbide (SiC).

5. The process for growing a crystal of a nitride semiconductor as set forth in claim 1, wherein the substrate comprises a substrate of sapphire ($Al_2O_3$).

6. The process for growing a crystal of a nitride semiconductor as set forth in claim 1, wherein the substrate has an off angle to a given crystal plane.

7. The process for growing a crystal of a nitride semiconductor as set forth in claim 1, wherein the reaction tube has its internal pressure reduced to a level sufficient to effect crystal growth.

8. The process for growing a crystal of a nitride semiconductor as set forth in claim 1, wherein the nitride semiconductor comprises a crystal selected from the group consisting of AlN, GaN, InN, BN and combinations thereof.

9. A process for growing a crystal of a nitride semiconductor which comprises:
the step of mounting a substrate in a reaction tube,
the step of feeding a first material gas containing a Group 3 element onto the substrate in the reaction tube, and
the step of feeding a second material gas containing elemental nitrogen onto the substrate in the reaction tube, said feeding steps being carried out alternately to deposit a nitride semiconductor crystal directly on the substrate,
wherein, the number of moles of the elemental nitrogen contained in the second material gas has a ratio of 450 or more to the number of moles of the Group 3 element in the first material gas until the film thickness of the nitride semiconductor crystal deposited on the substrate reaches a critical film thickness, whereas the number of moles of the elemental nitrogen contained in the second material gas has a ratio of less than 450 to the number of moles of the Group 3 element in the first material gas when the film thickness is equal to, or over the critical film thickness, said critical film thickness defined as the thickness of the film at which dislocations occur.

10. A process for growing a crystal of a nitride semiconductor as set forth in claim 9, wherein the number of times that the step of feeding a first material gas containing a Group 3 element onto the substrate in the reaction tube and the step of feeding a second material gas containing elemental nitrogen onto the substrate in the reaction tube are carried out alternately is from one up to ten times.

11. The process for growing a crystal of a nitride semiconductor as set forth in claim 10, wherein the number of times that the step of feeding a first material gas containing a Group 3 element onto the substrate in the reaction tube and the step of feeding a second material gas containing elemental nitrogen onto the substrate in the reaction tube are carried out alternately is six times.

12. The process for growing a crystal of a nitride semiconductor as set forth in claim 9, wherein the substrate is of silicon carbide (SiC).

13. The process for growing a crystal of a nitride semiconductor as set forth in claim 9, wherein the substrate comprises a substrate of sapphire ($Al_2O_3$).

14. The process for growing a crystal of a nitride semiconductor as set forth in claim 9, wherein the substrate has an off angle to a given crystal plane.

15. The process for growing a crystal of a nitride semiconductor as set forth in claim 9, wherein the reaction tube has its internal pressure reduced to a level sufficient to effect crystal growth.

16. The process for growing a crystal of a nitride semiconductor as set forth in claim 9, wherein the nitride semiconductor comprises a crystal selected from the group consisting of AlN, GaN, InN, BN and combinations thereof.

17. A process for growing a crystal of a nitride semiconductor which comprises:
the step of mounting a substrate in a reaction tube,
the step of feeding a first material gas containing a Group 3 element onto the substrate in the reaction tube, and
the step of feeding a second material gas containing elemental nitrogen onto the substrate in the reaction tube, said feeding steps being carried out alternately to deposit a nitride semiconductor crystal directly on the substrate,
wherein the number of moles of the elemental nitrogen contained in the second material gas has a ratio of more than 250 to the number of moles of the Group 3 element in the first material gas until the film thickness of the nitride semiconductor crystal deposited on the substrate reaches a critical film thickness, while the number of moles of the elemental nitrogen contained in the second material gas has a ratio of from 20 or more to 250 or less to the number of moles of the Group 3 element in the first material gas when the film thickness is equal to, or over the critical film thickness, said critical film thickness defined as the thickness of the film at which dislocations occur.

18. The process for growing a crystal of a nitride semiconductor as set forth in claim 17, wherein the number of times that the step of feeding a first material gas containing a Group 3 element onto the substrate in the reaction tube and the step of feeding a second material gas containing elemental nitrogen onto the substrate in the reaction tube are carried out alternately is from one up to ten times.

19. The process for growing a crystal of a nitride semiconductor as set forth in claim 18, wherein the number of times that the step of feeding a first material gas containing a Group 3 element onto the substrate in the reaction tube and the step of feeding a second material gas containing elemental nitrogen onto the substrate in the reaction tube are carried out alternately is six times.

20. The process for growing a crystal of a nitride semiconductor as set forth in claim 17, wherein the substrate is of silicon carbide (SiC).

21. The process for growing a crystal of a nitride semiconductor as set forth in claim 17, wherein the substrate comprises a substrate of sapphire ($Al_2O_3$).

22. The process for growing a crystal of a nitride semiconductor as set forth in claim 17, wherein the substrate has an off angle to a given crystal plane.

23. The process for growing a crystal of a nitride semiconductor as set forth in claim 17, wherein the reaction tube has its internal pressure reduced to a level sufficient to effect crystal growth.

24. The process for growing a crystal of a nitride semiconductor as set forth in claim 17, wherein the nitride semiconductor comprises a crystal selected from the group consisting of AlN, GaN, InN, BN and combinations thereof.

* * * * *